United States Patent
Kouznetsov

(10) Patent No.: US 9,361,994 B1
(45) Date of Patent: Jun. 7, 2016

(54) METHOD OF INCREASING READ CURRENT WINDOW IN NON-VOLATILE MEMORY

(71) Applicant: Cypress Semiconductor Corporation, San Jose, CA (US)

(72) Inventor: Igor Kouznetsov, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/740,139

(22) Filed: Jun. 15, 2015

Related U.S. Application Data

(60) Provisional application No. 62/045,978, filed on Sep. 4, 2014.

(51) Int. Cl.
*G11C 16/26* (2006.01)
*G11C 5/14* (2006.01)
*G11C 11/4074* (2006.01)

(52) U.S. Cl.
CPC ............... *G11C 16/26* (2013.01); *G11C 5/146* (2013.01); *G11C 11/4074* (2013.01)

(58) Field of Classification Search
CPC ..... G11C 16/26; G11C 5/146; G11C 11/4074
See application file for complete search history.

(56) References Cited

U.S. PATENT DOCUMENTS

| 5,027,320 | A | 6/1991 | Pathak et al. |
| 6,560,152 | B1 | 5/2003 | Cernea |
| 7,349,276 | B2 | 3/2008 | Tonda |
| 7,755,946 | B2 | 7/2010 | Dunga et al. |
| 7,957,215 | B2 | 6/2011 | Tanzawa |
| 7,969,804 | B1 | 6/2011 | Hirose et al. |
| 8,050,084 | B2 | 11/2011 | Bae et al. |
| 8,130,547 | B2 * | 3/2012 | Widjaja et al. ....... G11C 11/404 365/185.05 |
| 8,138,786 | B2 * | 3/2012 | Lewis et al. ......... G06F 17/5054 326/32 |
| 8,208,302 | B2 * | 6/2012 | Widjaja et al. ....... G11C 11/404 365/185.05 |
| 8,351,252 | B2 | 1/2013 | Chung |

OTHER PUBLICATIONS

Renesas Electronics Develops 28nm Embedded Flash Memory Technology that Realizes Even Faster Read and Rewrites Speeds for Automotive Microcontrollers, Renesas website: http://am.renesas.com/press/news/2015/news20150225a.jsp, published Feb. 25, 2015.
T. Tanaka, et al., "A temperature compensation word-line voltage generator for multi-level cell NAND Flash memories", Published Jan. 2010.

\* cited by examiner

*Primary Examiner* — Vanthu Nguyen

(57) ABSTRACT

A memory structure is provided including an array of non-volatile memory (NVM) cells arranged in rows and columns, each cell including a NVM transistor having a body bias terminal coupled to body bias supply. The memory structure further includes a control system to control the body bias supply to adjust a body bias voltage coupled to the body bias terminals during read operations of the memory structure to compensate for shifts in threshold voltages ($V_{TH}$) of the NVM transistors to maintain a read current window ($I_{RCW}$) between a cell in which the NVM transistor is ON and a sum of leakage current through cells in which the NVM transistor is OFF. Methods of operating the memory structure are also described.

18 Claims, 8 Drawing Sheets

METHOD OF INCREASING READ CURRENT WINDOW IN NON-VOLATILE MEMORY

CROSS-REFERENCE TO RELATED APPLICATIONS

This application claims the benefit of priority under 35 U.S.C. 119(e) to U.S. Provisional Patent Application Ser. No. 62/045,978, filed Sep. 4, 2014, which is incorporated by reference herein in its entirety.

TECHNICAL FIELD

The present disclosure relates generally to semiconductor memories, and more particularly to non-volatile memory structures and methods of operating the same.

BACKGROUND

One of the most important parameters in non-volatile memories (NVM) is the current window under read operation biases. In order to ensure reliable and fast access to data stored in non-volatile memory, technology developers and designers try to maximize the current window across entire operating temperature range (e.g., −40° C. to 85° C.), power supply range and process corners. The read current window ($I_{RCW}$) is defined as the difference between the minimum current conducted by a selected cell in erased state (low voltage threshold ($V_T$)) on one side and a sum of maximum currents conducted by a selected cell in programmed state (high $V_T$) and combined deselected cell currents (bit-line leakage) on the other. The resultant current window ($I_{RCW}$) is given by the following equation:

$$I_{RCW} = \min(Ie + Nm \times Idp) - \max(Ip + Nm - Ide) \approx \min(Ie) - \max(Ip + Nm \times Ide)$$

where Ie is the selected erased cell current, Ip is the selected programmed cell current, Ide is the deselected erased cell current, Idp is the deselected programmed cell current (minimum of Idp is a negligible value), and Nm=N−1 where N is the number of cells per bit-line.

Read current for selected erased and programmed cells as well as deselected cell leakage vary greatly with temperature, so having sufficient current window at one temperature (e.g., at room) does not guarantee a sufficient current window at temperature extremes. In particular, the current leakage through deselected cells increases exponentially with temperature and at high temperatures can exceed the selected erased cell current, forcing the current window to collapse which leads to memory read failure. Furthermore, variations in read current ($I_{RC}$) with temperature can lead to variations in access time (Ta) required to read the selected cell.

Past attempts to solve these problems in NVM using floating gate or charge-trapping technologies have relied on increased transistor gate lengths and widths, thick dielectric layers between a charge-trapping layer and the transistor channel, or reduced the number of cells per bit-line. However, thicker dielectric layers require larger program-erase voltages, possibly increasing power consumption and impeding integration of the NVM with lower voltage (CMOS) devices. Problems with increasing gate lengths and widths and/or reducing the number of cells per bit-line include limiting the reduction in memory size (or increases in memory density) despite advances in technology, which have enabled the size of active elements in the cell to be reduced to 65 nanometers (nm) and beyond.

Thus, there is a need for an improved memory structure as well as a method of operating the same.

SUMMARY

In accordance with embodiments of the present invention, a memory structure is provided that includes a body bias control system to supply body bias voltages to non-volatile memory (NVM) transistors to increase a read current window ($I_{RCW}$) in the memory structure.

In one embodiment the memory structure includes an array of NVM cells arranged in rows and columns, each cell including a NVM transistor having a drain coupled to a bit-line and a source coupled to a source-line in a column of the array, a gate coupled to a word-line in a row of the array, and body bias terminal coupled to body bias supply. The memory structure further includes a body bias control system to control the body bias supply to adjust a body bias voltage coupled to the body bias terminals during read operations of the memory structure to compensate for shifts in threshold voltages ($V_{TH}$) of the NVM transistors to maintain a read current window ($I_{RCW}$) between a cell in which the NVM transistor is ON and a sum of leakage current through cells in which the NVM transistor is OFF.

Methods of operating a memory including the memory structure are also described.

BRIEF DESCRIPTION OF THE DRAWINGS

Embodiments of the present invention will be understood more fully from the detailed description that follows and from the accompanying drawings and the appended claims provided below, where:

DETAILED DESCRIPTION

The present disclosure is directed generally to a memory structure including a control system to dynamically adjust a body bias voltage to non-volatile memory (NVM) transistors in the memory during read operations to increase a read current window between a read current through a cell in which the NVM transistor is ON, and leakage current through cells in which the NVM transistor is OFF, and methods for operating the same.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

The non-volatile memory may include NVM cells or cells with a NVM transistor or device, and the NVM transistor can be implemented using either floating gate or a charge-trapping technology. The charge-trapping technology can include Silicon-Oxide-Nitride-Oxide-Silicon (SONOS) or nano-crystal technology.

Figure 1:
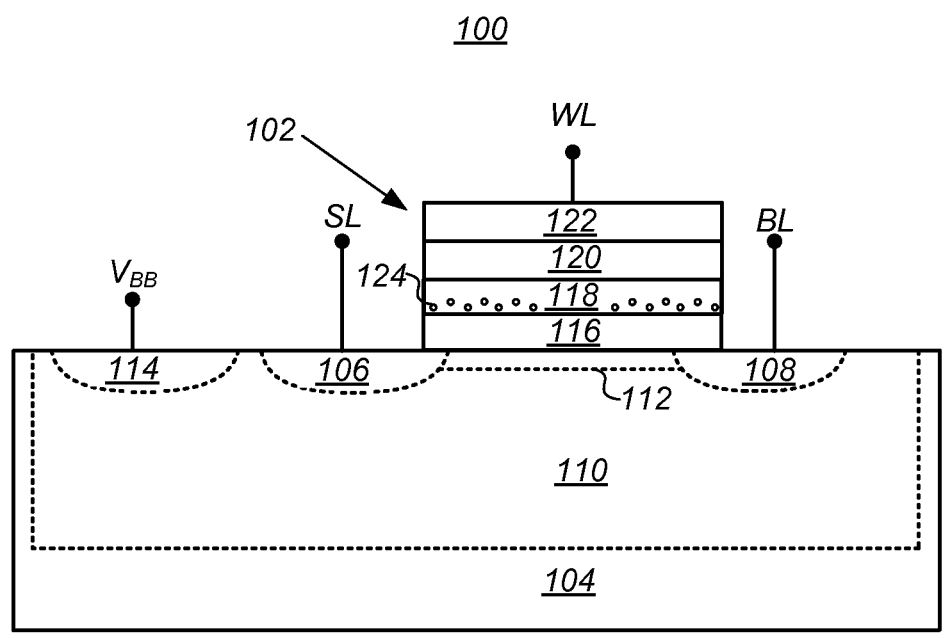
FIG. 1 is a block diagram illustrating a cross-sectional side view of a non-volatile memory (NVM) transistor or device.

Referring to FIG. 1, an NVM transistor 100 includes a gate stack 102 formed over a substrate 104. The NVM transistor 100 further includes source/drain regions 106/108 formed in a well 110 in the substrate 104 on either side of gate stack 102, a channel region 112 underneath gate stack, and a body bias terminal 114, also referred to as a well terminal or a bulk terminal, to form an ohmic contact with the well 110. The source region 106, drain region 108, channel region 112 and body bias terminal 114 are formed by implanting dopants of an appropriate type, depending whether the NVM transistor is a p-type or an n-type, by ion implantation or by diffusion into the well 110. The well 110 also may be formed by ion implantation or by diffusion. The source region 106, drain region 108 and body bias terminal 114 may further include a thin layer of silicide, not shown in this figure, to form ohmic contacts with the regions in substrate 104.

In one embodiment, the NVM device or transistor 100 is a SONOS-type NVM transistor and the gate stack 102 includes an oxide tunnel dielectric layer 116, one or more nitride or oxynitride charge-trapping layers 118, a top, blocking oxide layer 120 and a polysilicon (poly), a silicided polysilicon or a metal layer which serves as a control gate 122.

When the control gate 122, source region 106, drain region 108 and body bias terminal 114 are appropriately biased, electrons from the source/drain/channel regions are injected or tunnel through tunnel dielectric layer 116 and are trapped in the charge-trapping layer 118. The mechanisms by which charge is injected can include both Fowler-Nordheim (FN) tunneling and hot-carrier injection. The charge trapped in the charge-trapping layer 118 results in an energy barrier between the drain and the source, raising the threshold voltage $V_T$ necessary to turn off the NVM transistor 100 putting the transistor in a "programmed" state. The NVM transistor 100 can be "erased" or the trapped charge removed and replaced with holes by applying an opposite bias on the control gate 122. The source region 106, drain region 108 and body bias terminal 114 are biased to alter a threshold voltage ($V_{TH}$) required to program or erase the NVM transistor 100.

If the NVM transistor 100 is an n-type SONOS transistor, for example, the source region 106, drain region 108 and channel region 112 may be formed by implanting an n-type dopant, such as arsenic ($As^+$) or phosphorous ($P^+$), into a P-well 110 formed by implanting a p-type dopants, such as boron. The body bias terminal 114 may be formed by implanting p-type dopants, such as boron ($B^+$) or $BF_2^+$, to a concentration or dose of from about 3e13 to about 3e15 $cm^{-2}$ and at energy of from about 2 to about 20 KeV.

In another embodiment, the charge trapping NVM transistor 100 can use a nano-crystal technology. A nano-crystal charge trapping NVM transistor 100 further includes a number of 2-5 nm size nano-crystals 124 of an impurity, such as germanium or silicon, in a dielectric, such as silicon-dioxide ($SiO_2$), charge-trapping layer 118. Electron charge is stored in the nano-crystals 124 which are generally separated from each other by 5 nm or more of $SiO_2$ and from the channel region 112 or surface of the substrate by a $SiO_2$ tunnel dielectric layer 116 having a thickness of less than about 5 nm. Direct tunneling of charge from the inversion layer and its storage in the nano-crystal causes a shift in the $V_{TH}$ of the NVM transistor 100 detected via current sensing. The nano-crystals are formed using implantation and annealing or using direct deposition of the charge-trapping layer 118.

In another embodiment, the NVM transistor 100 can be a floating-gate MOS field-effect transistor (FGMOS) NVM transistor 100 or device. Generally, it is similar in structure to the SONOS NVM transistor 100 described above, differing primarily in that a FGMOS includes a polysilicon (poly) floating gate, which is capacitively coupled to inputs of the NVM transistor, rather than a nitride or oxynitride charge-trapping. Thus, the FGMOS NVM transistor can also be described with reference to FIG. 1. Referring to FIG. 1, a FGMOS NVM transistor 100 includes a gate stack 102 formed over a substrate 104. The FGMOS NVM transistor 100 further includes source/drain regions 106/108 formed in a well 110 in the substrate 104 on either side of gate stack 102, which define a channel region 112 underneath gate stack. Gate stack 102 includes a tunnel dielectric layer 116, a floating gate layer 118, a blocking oxide or top dielectric layer 120 and a polysilicon, silicided polysilicon or metal layer which serves as a control gate 122.

Similarly to the SONOS device described above the FGMOS NVM transistor 100 can be programmed by applying an appropriate bias between the control gate 122 and the source and drain regions 106/108 to inject charge into the floating gate layer 118, raising the threshold voltage $V_{TH}$ necessary to turn off the FGMOS NVM transistor. The FGMOS NVM transistor 100 can be erased or the trapped charge removed by applying an opposite bias on the control gate 122.

A memory array is constructed by fabricating a grid of cells arranged in rows and columns and connected by a number of horizontal and vertical control lines to peripheral circuitry such as address decoders and sense amplifiers. Each cell includes at least one non-volatile semiconductor device, such as those described above, and may have a one transistor (1T) or two transistor (2T) architecture.

Figure 2A:
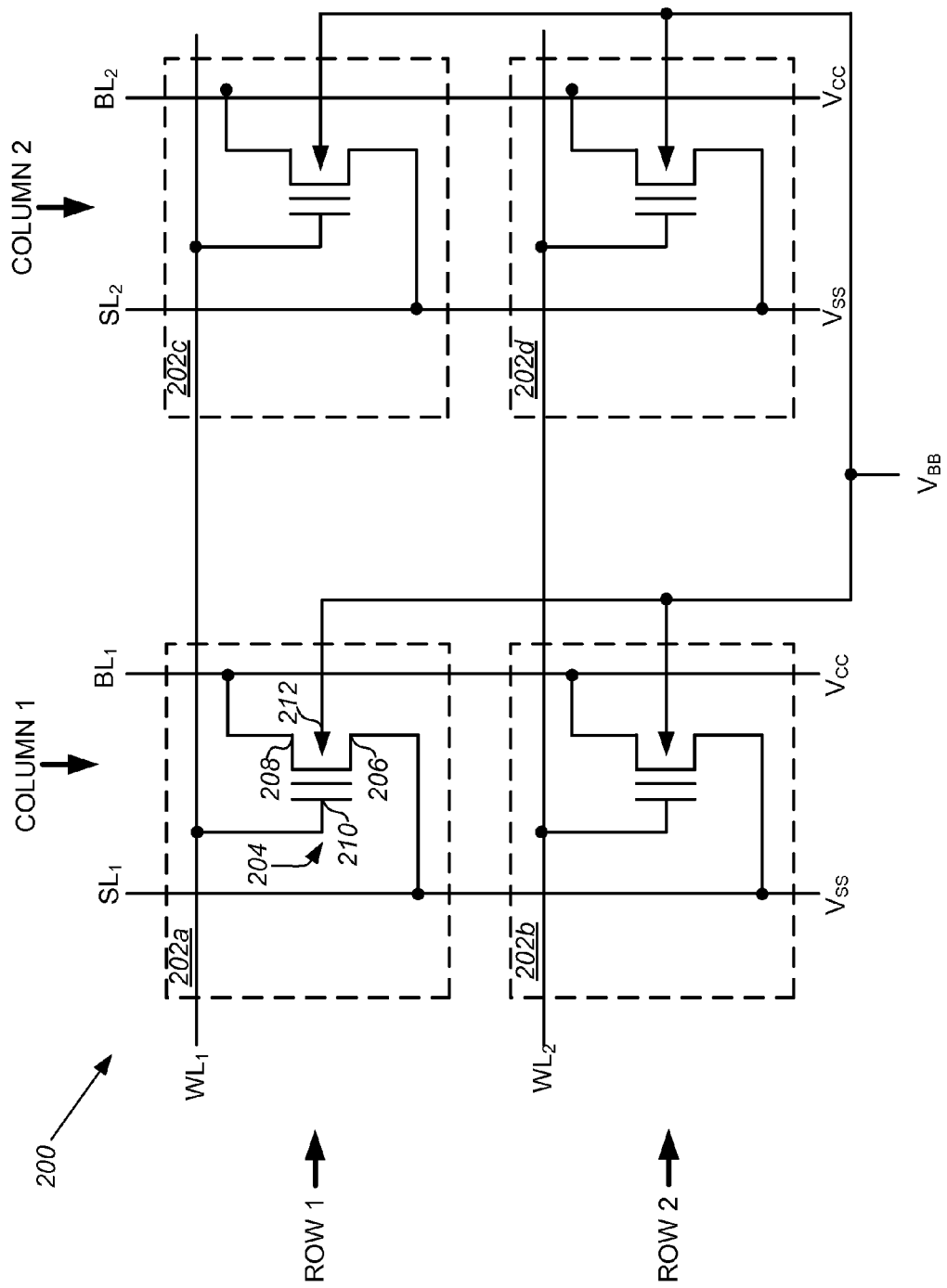
FIGS. 2A and 2B are schematic diagrams of a segment of a one transistor (1T) memory array illustrating an embodiment of an operation body bias control system according to the present disclosure.
Figure 2B:
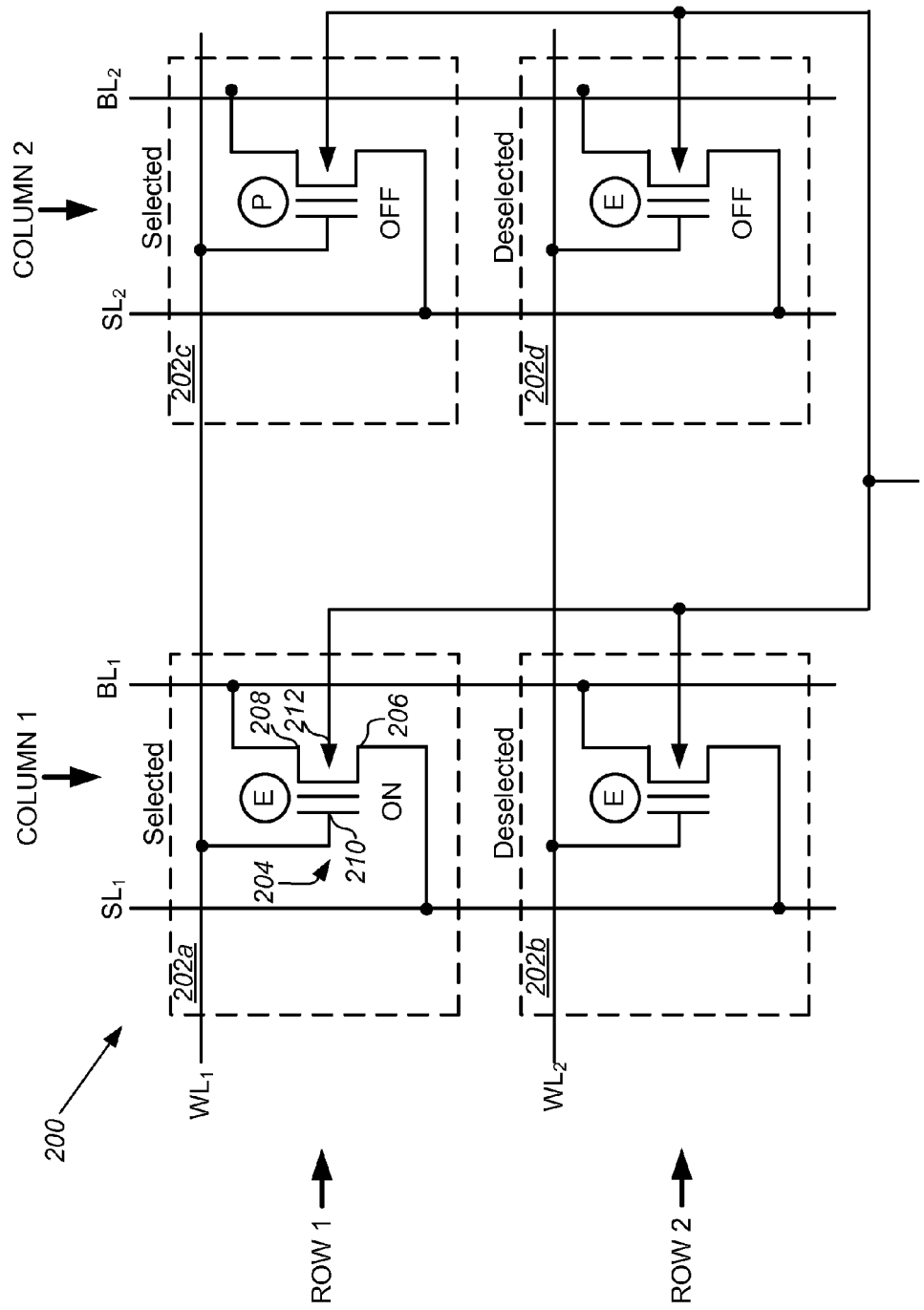

In one embodiment the array is a 1T NOR array in which each cell consists essentially of a single NVM transistor. A segment of a 1T NOR array 200 including four (4) cells 202a-d arranged in two rows and two columns is illustrated in FIGS. 2A and 2B. Referring to FIG. 2A, each cell 202a-d includes a NVM transistor 204 having a source 206 coupled through a source-line $SL_1/SL_2$ to a source voltage supply ($V_{SS}$), a drain 208 coupled through a bit-line $BL_1/BL_2$ to a drain voltage supply ($V_{CC}$), a control gate 210 coupled to a word-line $WL_1/WL_2$ and a body bias terminal 212 coupled to a body bias voltage ($V_{BB}$). As explained herein below $V_{BB}$ is between about −1.2V and −2.2V VDC, and is typically, smaller in magnitude than a negative high voltage ($V_{NEG}$) used in program and erase operations.

In embodiments in which the NVM transistor 204 is an n-type SONOS NVM transistor, during an erase operation to erase the cells 202a-d a negative high voltage ($V_{NEG}$), for example about −3.6 VDC, is applied to the word-line $WL_1/WL_2$ and a positive high voltage ($V_{POS}$), for example about +4.7 VDC, is applied to the source-line, the bit-line and the body bias terminal 212. Generally, the cells 202a-d are erased as part of a bulk erase operation in which all cells in selected rows of the memory array 200 are erased at once prior to a program operation to program one or more cells 202a-d by applying the appropriate voltages to a the word-line $WL_1/WL_2$ shared by all cells in the row, the body bias terminal 212, to all source-lines $SL_1/SL_2$ and to all bit-lines $BL_1/BL_2$ in the memory array.

During the program operation the voltages applied to the word-line $WL_1/WL_2$ and the bit-line $BL_1/BL_2$ in a selected row and column are reversed, with a positive programming voltage ($V_{POS}$) applied to the word-line and a negative voltage ($V_{NEG}$) applied to the bit-line, to apply a bias to program the memory transistor 204. In deselected rows, the word-lines are coupled to $V_{NEG}$. The body bias terminal 212 or connection to the well in which the memory transistor 204 is formed is coupled to $V_{NEG}$. The source-lines $SL_1/SL_2$ are coupled to electrical ground, $V_{NEG}$ or to a voltage between ground and $V_{NEG}$.

After an erase operation or program operation is completed, the state of the cells 202a-d can be read. Referring to FIG. 2B, during a read operation the source-lines $SL_1/SL_2$ are set to ground, bit-lines $BL_1/BL_2$ are set to a fixed voltage between ground and $V_{CC}$, and the word-line $WL_1$ in a selected row (shown here as Row 1) is set to $V_{CC}$, while the word-line $WL_2$ in a deselected row (shown here as Row 2) is set to ground. Typically, in the prior art the body bias terminals 212 of all NVM transistors were set to ground or to fixed, low voltage near ground set following fabrication of the memory structure to compensate for variations in threshold voltages ($V_{TH}$) of the NVM transistors arising from process variations in the fabrication of the NVM transistors. Thus, there is a read current window ($I_{RCW}$) defined as the difference between the sum of minimum current conducted by a selected cell in erased state 202a (low threshold VT) and minimum combined deselected sell 202c currents on one side and the sum of maximum current conducted by a selected cell in programmed state 202c (high threshold VT) and maximum combined deselected cell 202d currents (bit-line leakage). The resultant current window ($I_{RCW}$) is given by the following equation:

$$I_{RCW} = \min(Ie + Nm \times Idp) - \max(Ip + Nm \times Ide) \approx \min(Ie) - \max(Ip + Nm \times Ide)$$

where Ie is the selected erased cell current, Ip is the selected programmed cell current, Ide is the deselected erased cell current, Idp is the deselected programmed cell current (minimum of Idp is a negligible value), and Nm=N−1 where N is the number of cells per bit-line or column.

As noted above, read current for selected erased and programmed cells as well as deselected cell leakage vary greatly with temperature, so having sufficient current window at one temperature (e.g., at room) does not guarantee current window at temperature extremes. In particular, the current leakage through deselected cells increases exponentially with temperature and at high temperatures can exceed the selected erased cell current, forcing the current window to collapse which leads to memory read failure.

In contrast, in the memory structure and method of the present disclosure, and as shown in in FIGS. 2A and 2B, the body bias terminal 212 is coupled to a body bias voltage that is dynamically, and automatically adjusted during a read operation using body bias control system in response to a sensed change in leakage current, or environmental factors, such as voltage or temperature on the NVM transistors, to compensate for shifts in threshold voltages ($V_{TH}$) of the NVM transistors to maintain at least a minimum read current window ($I_{RCW}$) between a cell in which the NVM transistor is ON and a sum of leakage current through cells in which the NVM transistor is OFF. By a minimum read current window ($I_{RCW}$) it is meant a read current window ($I_{RCW}$) in which the read current ($I_{RC}$) through the cell in which the NVM transistor is ON is at least 3 µA greater, or has a current in a minimum ratio of at least from about 2.5 times greater that than the sum of leakage current through cells in which the NVM transistor is OFF, and generally a ratio of about 2.5 to about 25 times greater.

Figure 3:
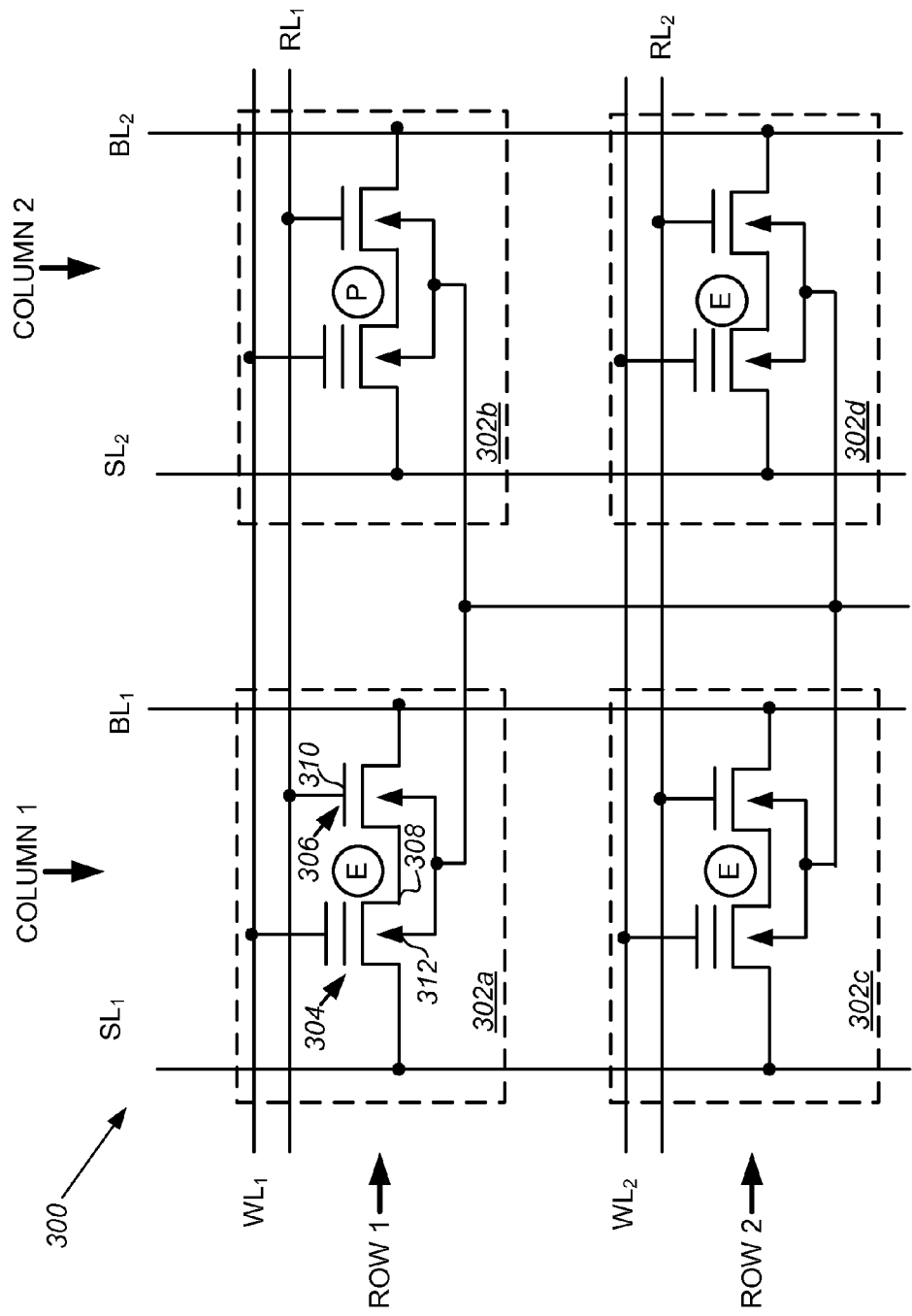
FIG. 3 is schematic diagram of a segment of a two transistor (2T) memory array illustrating an embodiment of an operation body bias control system according to the present disclosure.

In another embodiment, the memory array can include memory cells having multiple transistors per cell capable of storing multiple bits for the same number of cells. For example in the 2T NOR flash memory illustrated in FIG. 3, each memory cell has four possible states per cell, so it can store two bits of information per cell. The memory array 300 includes cells 302a-d having a 2T-architecture, in which each cell includes, in addition to a NVM transistor 304, a pass or select transistor 306, for example, a conventional IGFET integrally formed on a common substrate (not shown in this figure) with the NVM transistor 304, and through which a drain 308 of the NVM transistor is coupled to bit-lines $BL_1/BL_2$. The memory array 300 further includes read-lines $RL_1/RL_2$ coupled to a gate 310 of each select transistor 306 in each row of the memory array 300. During a program or erase operation the select or read-lines $RL_1/RL_2$ are coupled to electrical ground (0V), and the source-lines $SL_1/SL_2$ may be at equipotential with the bit-lines $BL_1/BL_2$, i.e., coupled to $V_{NEG}$ or $V_{POS}$, respectively, or allowed to float. During a read operation the select or read-line $RL_1/RL_2$ of a row selected to be read is coupled to a positive voltage ($V_{CC}$), while the read-lines of deselected rows are coupled to electrical ground (0V). As described above with respect to the 1T memory array 200, the body bias terminals 312 of the NVM transistors 304 are coupled to a body bias voltage that is dynamically and automatically adjusted during a read operation using a body bias control system to compensate for shifts in threshold voltages ($V_{TH}$) of the NVM transistors. Optionally, as in the embodiment shown, the select transistors 306 can share a common body bias connection with the NVM transistors 304.

A body bias control system and method of operating the same to dynamically, and automatically adjust a body bias voltage during a read operation will now be described with reference to FIGS. 4 through 8.

Figure 4:
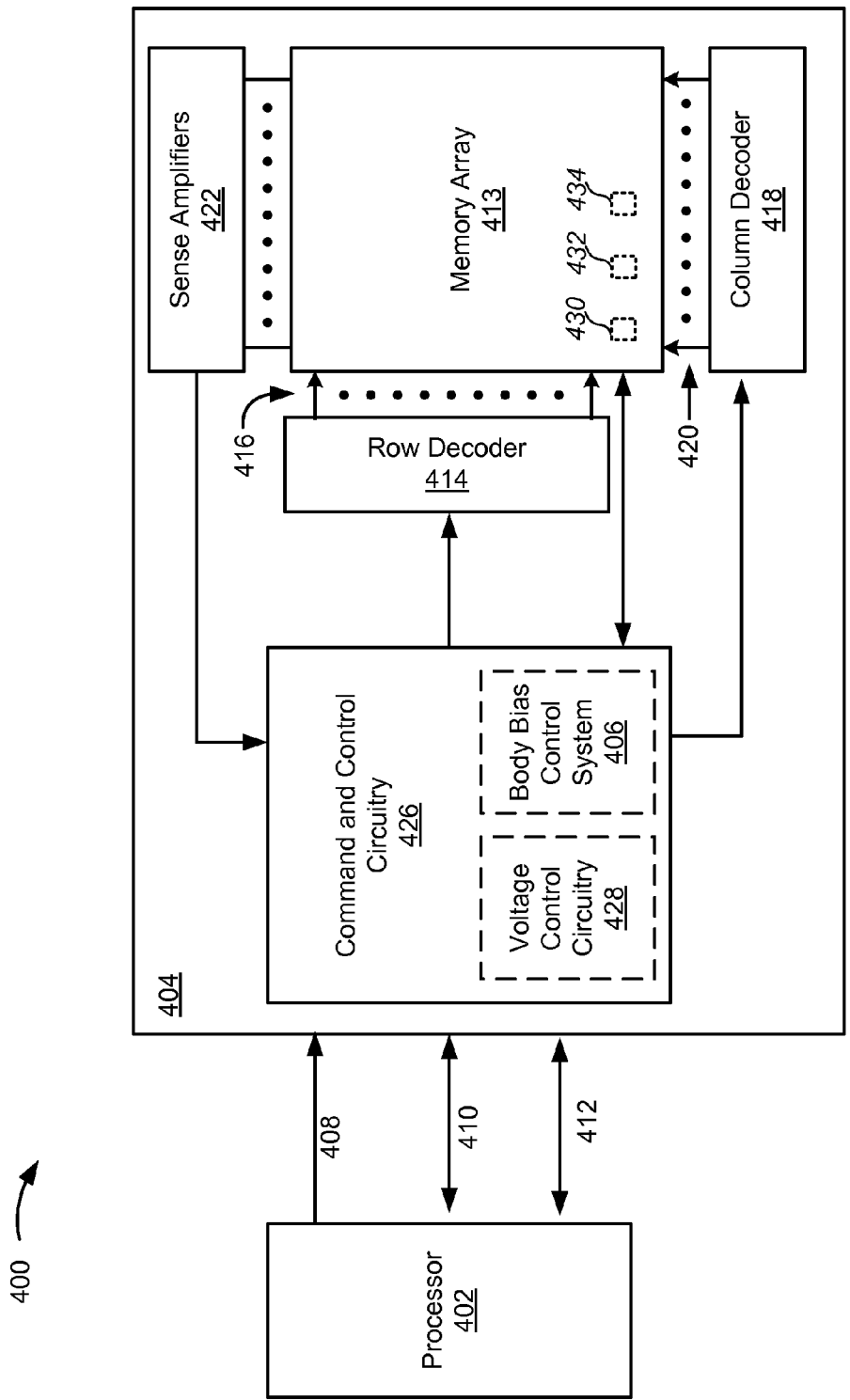
FIG. 4 is a block diagram illustrating a processing system including a processor coupled to memory structure with a body bias control system according to an embodiment of the present disclosure.

FIG. 4 is a block diagram illustrating a processing system 400 including a processor 402 coupled to memory structure 404 with a body bias control system 406. Referring to FIG. 4, generally the processor 402 is coupled to memory structure 404 in a conventional manner via an address bus 408, a data bus 410 and a control bus 412. It will be appreciated by those skilled in the art that the processing system 400 of FIG. 4 has been simplified for the purpose of illustrating the present invention and is not intended to be a complete description. In particular, details of the processor, row and column decoders, sense amplifiers and command and control circuitry, which are known in the art have are not described in detail herein.

The processor 402 may be a type of general purpose or special purpose processing device. For example, in one embodiment the processor can be a processor in a programmable system or controller that further includes a non-volatile memory, such as a Programmable System On a Chip or PSoC™ controller, commercially available from Cypress Semiconductor of San Jose, Calif.

The memory structure 404 includes a memory array 413 organized as rows and columns of bit-cells (not shown in this figure) as described above. The memory array 413 is coupled to a row decoder 414 via multiple word-lines 416 and, in certain 2T embodiments read lines, with at least one read-line for each row of the memory array as described above. The memory array 413 is further coupled to a column decoder 418 via a multiple bit-lines and source-lines 420 (one each for each column of the memory array) as described above. The memory array 413 is further coupled to a plurality of sense amplifiers 422 to read multi-bit words therefrom. The non-volatile memory structure 404 further includes command and control circuitry 426 to control the row decoder 414, the column decoder 418 and sense amplifiers 422, and to receive read data from sense amplifiers. The command and control circuitry 426 includes voltage control circuitry 428 to generate the voltages needed for operation of the non-volatile memory structure 404, including $V_{POS}$, $V_{NEG}$, $V_{CC}$, and $V_{SS}$, which is routed through the command and control circuitry to the row decoder 414, column decoder 418 during read, erase and program operations.

As described above, the body bias control system 406 is configured to dynamically, and automatically adjust a body bias voltage applied to the body bias terminals (not shown in this figure) in the memory array 413 during a read operation to compensate for shifts in threshold voltages ($V_{TH}$) of the NVM transistors. Generally, the body bias control system 406 further includes a first device 430 integrally formed on a substrate with the cells of the memory array 413 to generate a first signal representing a read current through a cell in which the NVM transistor is ON, and a number of second devices 432 to generate a second signal representing the sum of leakage current through cells in which the NVM transistor is OFF.

In one embodiment, the first device 430 can include a replica device or NVM transistor having a gate to source voltage ($V_{GS}$) to replicate current through a selected, erased cell. Alternatively, the first device 430 can include a NVM transistor in a selected, cell known to be erased to generate a first signal substantially equal to current through a selected, erased cell, or a fixed reference current source to generate a current replicating current through a selected, erased cell.

Similarly, the second device 432 can also include one or more replica devices or NVM transistors having a gate to source voltage ($V_{GS}$) to replicate current through a deselected, erased cell. That is the second device 432 can include a single device to replicate current through a deselected, erased cell, which the body bias control system 406 then multiplies by a factor, S, equal to the number of deselected cells in a column of the memory array 413 or n−1, where n is the number of cells in a column of the memory array. Alternatively, the second device 432 can include n−1 NVM transistors in a deselected column of the memory array 413 known to be erased to generate the second signal.

In yet another embodiment, the body bias control system 406 alternatively or additionally includes a temperature sensor 434 integrally formed on a substrate with the cells of the memory array, and the body bias control system is configured to adjust the body bias voltage in response to a signal from the temperature sensor. In one embodiment, the body bias control system couples a reverse body bias (RBB) to the body bias terminals, and is configured to increase a magnitude of the RBB with an increase in sensed temperature. The body bias control system 406 can include a processor to calculate an increase in magnitude of the RBB with an increase in sensed temperature by execution of an algorithm stored in firmware of the body bias control system, or by reference to a look-up table that may be stored, for example, in the firmware.

Figure 5:
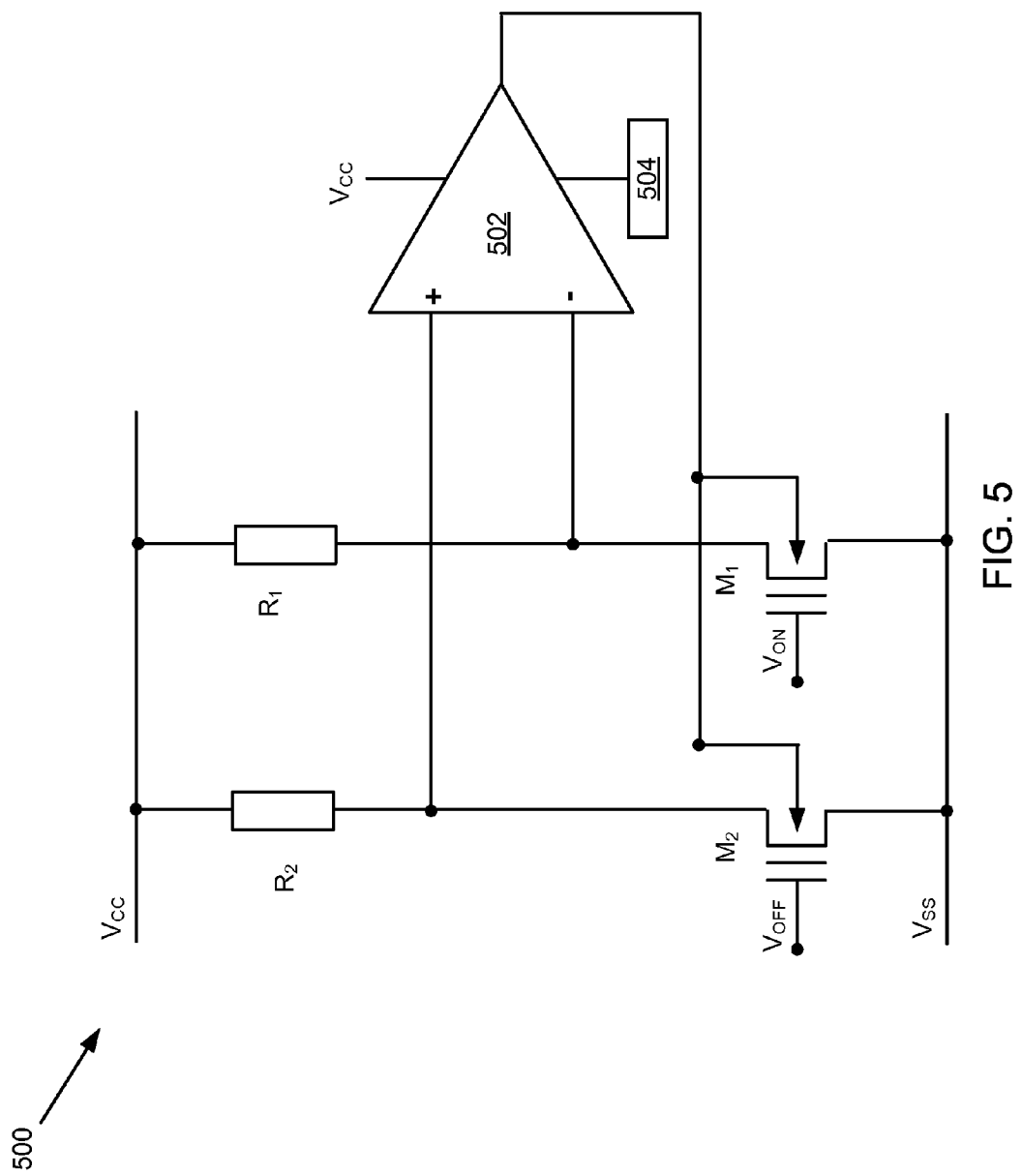
FIG. 5 is a block diagram illustrating a body bias control system according to an embodiment of the present disclosure.

Details of the body bias control system of a memory structure according to various embodiments of the present disclosure will now be described with reference to FIG. 5. Referring to FIG. 5, in one embodiment the body bias control system 500 includes a differential amplifier or comparator 502, such as an operational amplifier having an inverting input, a non-inverting input and output coupled to body bias terminals of NVM transistors in the memory array. The comparator 502 is supplied with a high positive voltage from $V_{CC}$, and a high, or larger magnitude negative voltage which is below $V_{SS}$ and ground, and may be supplied a negative charge pump 504.

Coupled to the inverting input is a first device to generate a first signal representing a read current through a cell in which the NVM transistor is ON. In the embodiment shown, the first device includes a transistor $M_1$ coupled to a source voltage supply ($V_{SS}$), and to a drain voltage supply ($V_{CC}$) through a first resistance element or resistor R1. Transistor $M_1$ can include an erased, actual or a replica NVM transistor integrally formed on a common substrate with NVM transistors of a memory array to a gate of which a voltage ($V_{ON}$) is applied to turn on transistor $M_1$.

Coupled to the non-inverting input are a number of second devices to generate a second signal representing a sum of leakage current through cells in which the NVM transistor is OFF. In the embodiment shown the number of second devices includes a number of transistors $M_2$, only one of which is shown, coupled in parallel to $V_{SS}$, and to $V_{CC}$ through a second resistance element or resistor R2. Transistor $M_2$ can include an erased, replica NVM transistors or actual erased NVM transistors in a deselected column of the memory array to gates of which a voltage ($V_{OFF}$) is applied to turn OFF transistors $M_2$. The leakage current through transistors $M_2$ is multiplied by S, the desired ratio of read current ($I_{RC}$) through a cell that is ON and column leakage current to maintain a desired minimum read current window. By a minimum $I_{RCW}$ it is meant an $I_{RCW}$ in which a difference between a read current ($I_{RC}$) through the cell in which the NVM transistor is ON is at least 3 µA greater, or has a current in a ratio of from about 2.5 to about 25 times greater than the sum of leakage current through cells in which the NVM transistor is OFF.

Generally, resistors R1 and R2 are equal in value, however it will be understood that in certain, other embodiments resistors R1 may not be equal to R2 in order to provide a desired ratio between the read current ($I_{RC}$) through the cell in which the NVM transistor is ON and the sum of leakage current through cells in which the NVM transistor is OFF.

When OFF current of $M_2$ is higher than ON current of $M_1$, the imbalance in drain voltages drives the comparator 502 so as to increase the reverse body bias (RBB) coupled from an output of the comparator to body bias terminals of $M_1$, $M_2$ and NVM transistors in the memory array, raising the effective threshold voltage ($V_{TH}$) of all of the NVM transistors and reducing both the read current ($I_{RC}$) through the cell in which the NVM transistor is ON and the sum of leakage current through cells in which the NVM transistor is OFF. However, since the read current ($I_{RC}$) through the cell in which the NVM transistor is ON is through a single transistor, the change in read current ($I_{RC}$) through the cell in which the NVM transistor is ON is linear, whereas the change in the sum of leakage current is due to the change in current through a number (n−1) of erased cells in a deselected column, change in the sum of leakage current is exponential, thereby increasing the read current window ($I_{RCW}$).

When the OFF current of $M_2$ is lower than ON current of $M_1$, the imbalance in drain voltages is reversed and the comparator 502 decreases the magnitude of the reverse body bias (RBB), lowering the effective threshold voltage ($V_{TH}$) of all of the NVM transistors and increasing both the read current ($I_{RC}$) through the cell in which the NVM transistor is ON, and the sum of leakage current. This increase in currents continues, until a negative feedback loop formed by the output of the comparator 502, body bias terminal of $M_2$, and the drain voltage of $M_2$ coupled to the non-inverting input of the comparator adjusts the body bias until the OFF current of $M_2$ and ON current of $M_1$ are substantially equal.

Figure 6A:
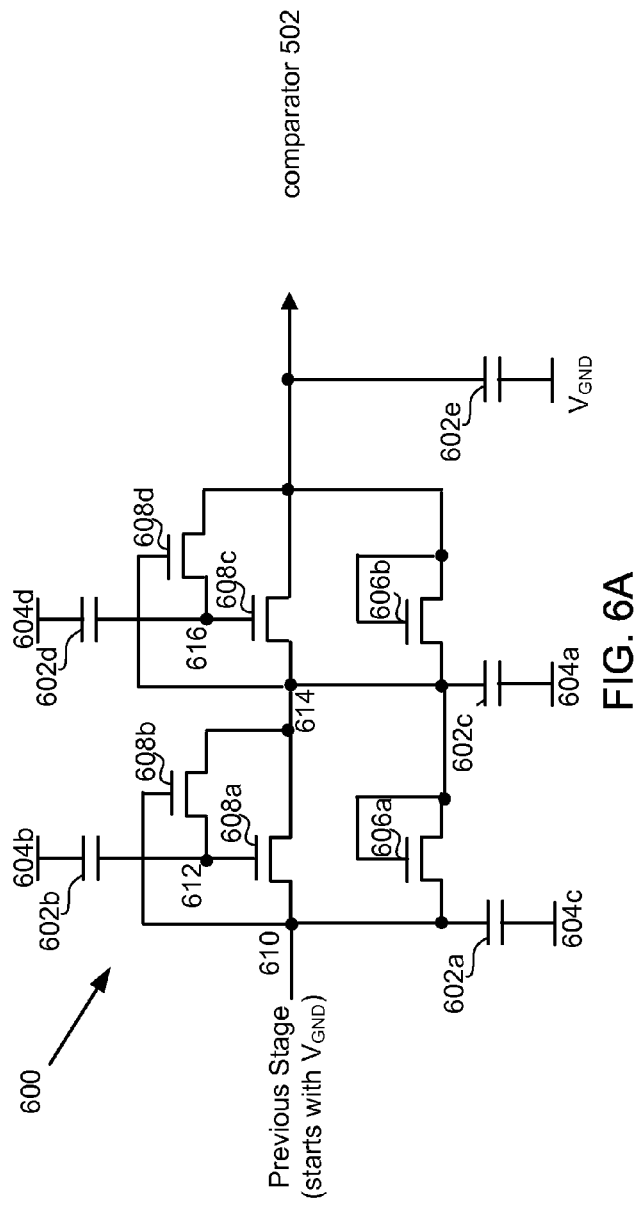
FIG. 6A is a schematic diagram illustrating a negative charge pump according to an embodiment of the present disclosure.
Figure 6B:
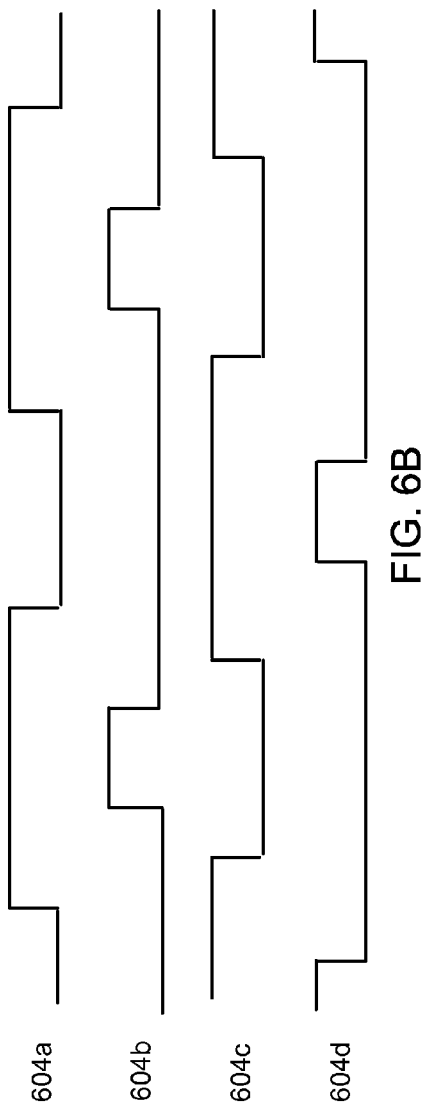
FIG. 6B illustrates clock signals applied to the negative charge pump of FIG. 6A according to an embodiment of the present disclosure.

FIG. 6A is a schematic diagram illustrating one stage of a negative charge pump for use in an embodiment the body bias control system 500. It is understood by those skilled in the art that the negative charge pump may have one or more preceding stages just like the stage shown, e.g., two. The input of the first stage is coupled to ground ($V_{GND}$). Referring to FIG. 6A, the negative charge pump 600 includes a number of capacitors 602a-d coupled between clock signals 604a-d and transistor switches 608a-d, an output capacitor 602e coupled in parallel across a negative output voltage ($V_{NEG}$) and a positive voltage, such as ground ($V_{GND}$), a number of diode connected transistors 606a-b coupled in series separating legs formed by the capacitors, and a number of switching elements 608a-d controlled by a four-phase clock 604a-d (illustrated in FIG. 6B), capable of switching the switching elements at frequency of 10 kilohertz up to 100 megahertz. In a first cycle, clock 604c switches to low level, coupling node 610 to a lower voltage. While clock 604a is high, switching elements 608b and 608c are open or present high impedance, while switching element 608d is closed or presents a low impedance and pre-charges node 616. Clock 604b then switches to high level and couples the pre-charged node 612 to a higher voltage, closing the switching element 608a which passes the negative charge from node 610 to node 614. In a second cycle, clock 604a switches to low level, coupling node 614 to an even lower voltage. Switching elements 608d and 608a are open, while switching element 608b is closed and pre-charges node 612. Clock 604d then switches to high level and couples the pre-charged node 616 to a higher voltage, closing the switching element 608c which passes the negative charge from node 614 to the charge pump output. The pulsing nature of the negative output voltage can be filtered or smoothed by the use of an output capacitor 602e.

Figure 7:
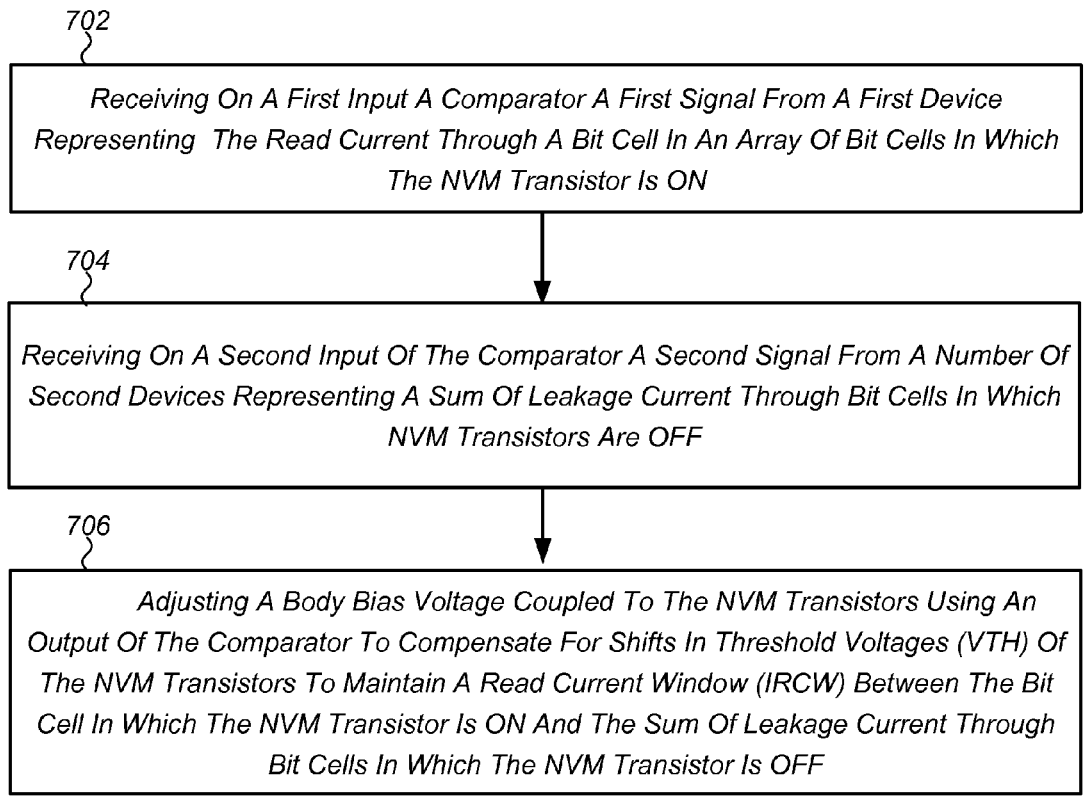
FIG. 7 is a flowchart illustrating a method for increasing a read current window in a NVM according to an embodiment of the present disclosure.

FIG. 7 is a flowchart illustrating a method for increasing a read current window in a NVM according to an embodiment of the present disclosure. Referring to FIG. 7, the method begins with receiving on a first input a comparator a first signal from a first device representing the read current through a cell in an array of cells in which the NVM transistor is ON (702). As explained above with reference to FIGS. 4 and 5, the first device can include: (i) a reference current source, such as a bandgap circuit; (ii) a replica device or replica NVM transistors integrally formed on a common substrate with NVM transistors of a memory array; or (iii) an actual NVM transistor in a selected, cell known to be erased.

Next, a second signal is received on a second input of the comparator from a number of second devices representing a sum of leakage current through cells in which NVM transistors are OFF (704). As explained above with reference to FIGS. 4 and 5, the number of second devices can include: (i) a number of replica device or replica NVM transistors integrally formed on a common substrate with NVM transistors of a memory array; (ii) multiple (n−1) actual NVM transistors in a deselected column of n cells in the memory array known to be erased; or (iii) a single actual or replica NVM transistor the leakage current through which the body bias control system then multiplies by a factor, S, equal to the number of deselected cells in a column of the memory array.

Finally, a body bias voltage coupled to body bias terminals of the NVM transistors is adjusted using an output of the comparator to compensate for shifts in threshold voltages ($V_{TH}$) of the NVM transistors to maintain a read current window ($I_{RCW}$) between the cell in which the NVM transistor is ON and the sum of leakage current through cells in which the NVM transistor is OFF (706).

Figure 8:
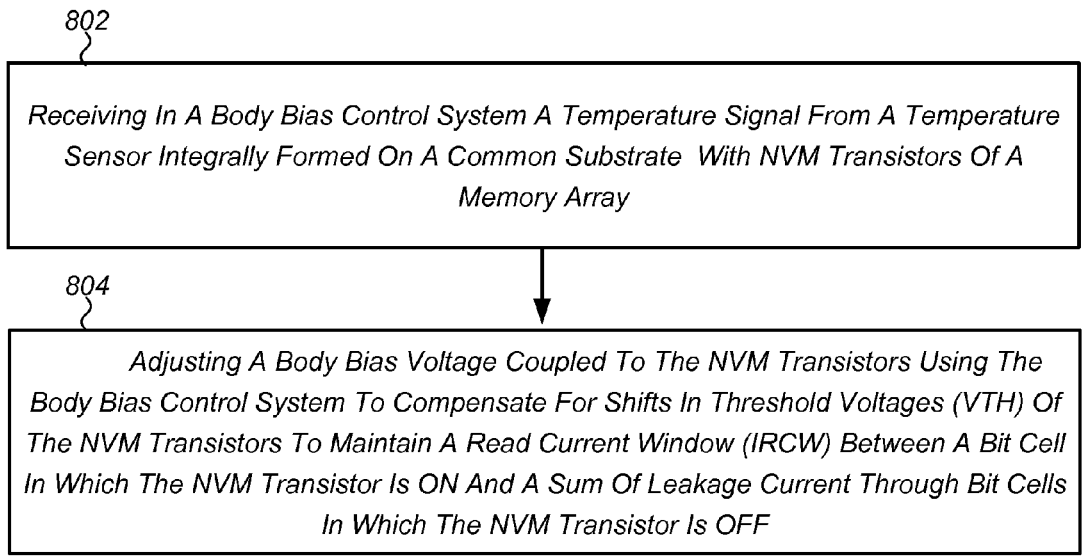
FIG. 8 is a flowchart illustrating a method for increasing a read current window in an NVM using a body bias control system according to an embodiment of the present disclosure.

Alternatively or additionally the body bias control system can further include a temperature sensor, such as temperature sensor 434 shown in FIG. 4, integrally formed on a common substrate with NVM transistors of a memory array, and the method can include adjusting a body bias voltage coupled to body bias terminals of the NVM transistors in response to a change in sensed temperature. Referring to FIG. 8, the method begins with receiving in the body bias control system a temperature signal from a temperature sensor integrally formed on a common substrate with NVM transistors of the memory array (802). Next, the body bias voltage coupled to the NVM transistors is adjusted using the body bias control system to compensate for shifts in threshold voltages ($V_{TH}$) of the NVM transistors to maintain a read current window ($I_{RCW}$) between a cell in which the NVM transistor is ON and a sum of leakage current through cells in which the NVM transistor is OFF (804). As explained above with reference to FIGS. 4 and 5, the body bias control system can include a processor to calculate an increase a magnitude of the RBB with an increase in sensed temperature by execution of an algorithm stored in firmware of the body bias control system, or by reference to a look-up table that may be stored, for example, in the firmware.

Thus, embodiments of memory structure including a body bias control system to dynamically adjust a body bias voltage to bias the NVM transistors during read operations of the array to increase a read current window between a read current through a cell in which the NVM transistor is ON, and leakage current through cells in which the NVM transistor is OFF, and methods for operating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory structure comprising:
    an array of cells arranged in rows and columns, each cell including a non-volatile memory (NVM) transistor having a body bias terminal; and
    a control system to adjust a body bias voltage coupled to the body bias terminals during read operations compensate for shifts in threshold voltages ($V_{TH}$) of the NVM transistors to maintain a read current window ($I_{RCW}$) between a cell in which the NVM transistor is ON and a sum of leakage current through cells in which the NVM transistor is OFF.

2. The memory structure of claim 1, wherein the control system comprises a temperature sensor integrally formed on a substrate with the array of cells, and wherein the control system is configured to adjust the body bias voltage in response to a signal from the temperature sensor.

3. The memory structure of claim 2, wherein the control system couples a reverse body bias (RBB) to the body bias terminals, and wherein the control system is configured to increase a magnitude of the RBB with an increase in sensed temperature.

4. The memory structure of claim 1, wherein the control system comprises a comparator having a first input coupled to receive from a first device a first signal representing a read current through the cell in which the NVM transistor is ON, a second input coupled to receive from a number of second devices a second signal representing the sum of leakage current through cells in which the NVM transistor is OFF, and an output through which the body bias voltage is coupled to body bias terminals.

5. The memory structure of claim 4, wherein the number of second devices comprise deselected, erased cells in a column of the array.

6. The memory structure of claim 5, wherein the number of second devices comprise a selected, programmed cell in the same column.

7. The memory structure of claim 4, wherein the number of second devices comprises a replica device integrally formed on a substrate with the array of cells to replicate current through a deselected, erased cell.

8. The memory structure of claim 4, wherein the first device comprises a selected, erased cell.

9. The memory structure of claim 4, wherein the first device comprises a replica device integrally formed on a substrate with the array of cells to replicate current through a selected, erased cell.

10. The memory structure of claim 4, wherein the control system couples a reverse body bias (RBB) to the NVM transistors, and wherein the control system comprises a negative feedback to increase a magnitude of the RBB with an increase in the sum of leakage current through NVM transistors which are OFF.

11. The memory structure of claim 4, wherein the control system is configured to maintain at least minimum ratio of the read current through the NVM transistor which is ON to the sum of leakage current through NVM transistors which are OFF.

12. The memory structure of claim 1, wherein the cells are multiple transistor cells, each cell further including a select transistor, and wherein the control system is further configured to adjust a body bias voltage coupled to a body bias terminal of the select transistor.

13. The memory structure of claim 12, wherein the cells are 2T cells.

14. A memory structure comprising:
    an array of cells arranged in rows and columns, each cell including a non-volatile memory (NVM) transistor having a body bias terminal; and
    a control system including a comparator having a first input coupled to receive from a first device a first signal representing a read current through a cell in which the NVM transistor is ON, a second input coupled to receive from a number of second devices a second signal representing a sum of leakage current through cells in which the NVM transistors are OFF, and an output coupled to the body bias terminals to adjust a magnitude of a reverse body bias (RBB) voltage during read operations to compensate for shifts in threshold voltages ($V_{TH}$) of the NVM transistors to maintain a read current window ($I_{RCW}$) between a cell in which the NVM transistor is ON and a sum of leakage current through cells in which the NVM transistor is OFF.

15. The memory structure of claim 14, wherein the number of second devices comprises a replica device integrally formed on a substrate with the array of cells to replicate current through a deselected, erased cell.

16. The memory structure of claim 14, wherein the first device comprises a replica device integrally formed on a substrate with the array of cells to replicate current through a selected, erased cell.

17. The memory structure of claim 14, wherein the control system couples a reverse body bias (RBB) to the NVM transistors, and wherein the control system comprises a negative feedback to increase a magnitude of the RBB with an increase in the sum of leakage current through NVM transistors which are OFF.

18. The memory structure of claim 14, wherein the cells are multiple transistor cells, each cell further including a select transistor, and wherein the control system is further configured to adjust a body bias voltage coupled to a body bias terminal of the select transistor.

* * * * *